US008897082B2

(12) United States Patent
Koike

(10) Patent No.: US 8,897,082 B2
(45) Date of Patent: Nov. 25, 2014

(54) DATA TRANSMISSION CIRCUIT AND SEMICONDUCTOR MEMORY DEVICE INCLUDING THE SAME

(71) Applicant: Panasonic Corporation, Osaka (JP)

(72) Inventor: Tsuyoshi Koike, Shiga (JP)

(73) Assignee: Panasonic Corporation, Osaka (JP)

( * ) Notice: Subject to any disclaimer, the term of this patent is extended or adjusted under 35 U.S.C. 154(b) by 253 days.

(21) Appl. No.: 13/661,711

(22) Filed: Oct. 26, 2012

(65) Prior Publication Data

US 2013/0051163 A1  Feb. 28, 2013

Related U.S. Application Data

(63) Continuation of application No. PCT/JP2011/004372, filed on Aug. 2, 2011.

(30) Foreign Application Priority Data

Sep. 2, 2010  (JP) .................................. 2010-197077

(51) Int. Cl.
*G11C 7/00* (2006.01)
*G11C 29/02* (2006.01)

(52) U.S. Cl.
CPC ............ *G11C 29/026* (2013.01); *G11C 29/028* (2013.01); *G11C 29/023* (2013.01)
USPC ........................ 365/189.15; 365/198; 365/203

(58) Field of Classification Search
CPC ....... G11C 8/12; G11C 11/4091; G11C 5/147
USPC ..................... 365/189.15, 198, 203
See application file for complete search history.

(56) References Cited

U.S. PATENT DOCUMENTS

| 5,418,749 A | 5/1995 | Suda et al. |
| 5,555,210 A | 9/1996 | Kato |
| 6,067,256 A * | 5/2000 | Yamashita et al. ........ 365/189.04 |
| 2009/0168499 A1 | 7/2009 | Kushida et al. |

FOREIGN PATENT DOCUMENTS

| JP | 06-084376 A | 3/1994 |
| JP | 06-162776 A | 6/1994 |
| JP | 07-085669 A | 3/1995 |
| JP | 07-262784 A | 10/1995 |
| JP | 2002-230980 A | 8/2002 |
| JP | 2009-163787 A | 7/2009 |

OTHER PUBLICATIONS

International Search Report issued in International Patent Application No. PCT/JP2011/004372 dated Oct. 25, 2011.

* cited by examiner

*Primary Examiner* — Son Dinh
*Assistant Examiner* — Nam Nguyen
(74) *Attorney, Agent, or Firm* — McDermott Will & Emery LLP

(57) ABSTRACT

The data transmission circuit includes: a plurality of local bit line pairs through which data is read simultaneously; a plurality of voltage change detection circuits provided for the plurality of local bit line pairs; a global bit line pair; a plurality of column selection circuits configured to select one of the local bit line pairs and connect the selected local bit line pair to the global bit line pair; and a sense amplifier connected to the global bit line pair. The sense amplifier is controlled by a sense amplifier activation signal to which the outputs of the plurality of voltage change detection circuits are connected, whereby the voltage of a selected read data line pair is amplified using discharge of a non-selected read data line pair, to achieve high-speed read.

16 Claims, 15 Drawing Sheets

DATA TRANSMISSION CIRCUIT AND SEMICONDUCTOR MEMORY DEVICE INCLUDING THE SAME

CROSS-REFERENCE TO RELATED APPLICATION

This is a continuation of PCT International Application PCT/JP2011/004372 filed on Aug. 2, 2011, which claims priority to Japanese Patent Application No. 2010-197077 filed on Sep. 2, 2010. The disclosures of these applications including the specifications, the drawings, and the claims are hereby incorporated by reference in their entirety.

BACKGROUND

The present disclosure relates to a data transmission circuit and a semiconductor memory device including the same, and more particularly to a semiconductor memory device having a sense amplifier.

When a latch-type sense amplifier is used for speeding up a dynamic circuit including bit lines, design of a timing circuit that determines startup of the sense amplifier poses a major problem. That is, when the sense amplifier is started with no sufficient potential difference having occurred in the bit line pair, speedup may be achieved but the possibility of causing erroneous read increases. Conversely, when the sense amplifier is started after appearance of a large potential difference in the bit line pair, the possibility of causing erroneous read may decrease but no speedup is achieved.

To address the above problem, conventionally, the startup timing of a sense amplifier has been determined in the following manner. While the timing at which the speed of read from memory cells is lowest is predicted to secure a margin for preventing erroneous read, the delay timing of a delay circuit including inverters, etc. is set at design time so that the sense amplifier be started at high speed. However, the prediction of a necessary timing margin is becoming increasingly difficult because variations in the potential difference in the bit line pair are increasing due to variations among production lots, random variations in a chip, etc. caused by miniaturization. As a means for solving this problem, a technique is known where a voltage change in the bit line pair is detected to generate a startup signal for the sense amplifier automatically (see Japanese Patent Publication No. H6-84376 (Patent Document 1)).

SUMMARY

In general, in a semiconductor memory device using a sense amplifier, the sense amplifier startup timing is designed, using a delay circuit including logic gates such as inverters and NAND gates, a replica circuit, etc., so that the sense amplifier be activated at the time when the potential difference in a bit line pair reaches about 100 mV after data in a memory cell is read to the bit line pair in response to activation of a word line. However, the delay circuit including logic gates is different in device type and layout from the memory cells, and thus there is no correlation between variations in one device from those in the other. It is therefore difficult to start the sense amplifier stably at the time of an optimum potential difference in the bit line pair.

A circuit for generating a sense amplifier activation signal using a replica circuit has also a problem. Conventionally, variations in the characteristics of transistors in a chip plane have become significant due to miniaturization. Therefore, in use of a replica circuit, it is desirable to place the replica circuit near a memory cell from which data is to be read. However, if replica circuits are provided near memory cells for all bits, the area of the memory array will increase. Conversely, if the minimum number of replica circuits are placed to avoid area increase, the margin of the sense amplifier startup timing will become excessively large or small.

By contrast, in the circuit configuration described in Patent Document 1, the sense amplifier is started once it is detected that the voltage of one bit line of a bit line pair has reached the threshold of a detection transistor after appearance of a potential difference in the bit line pair in response to activation of a word line. It is therefore possible to start the sense amplifier at the time of an optimum potential difference in the bit line pair. However, the circuit disclosed in Patent Document 1 has the following problems.

The first problem is that, in the circuit configuration of Patent Document 1, the sense amplifier is not activated until one bit line reaches the threshold of the detection transistor. The threshold of a transistor is generally 200 mV or more in consideration of the leakage current, the reliability against noise, etc. Therefore, the time taken until startup of the sense amplifier is additionally required compared with the case of designing the sense amplifier startup timing using a delay circuit.

The second problem is that, after the voltage has reached the threshold of the detection transistor, the capability of driving the gate of the detection transistor is very low. The reason is that the bit line, the detection transistor, and the sense amplifier do not serve to amplify the voltage change of the bit line, but merely receive the voltage of the bit line pair with a buffer and feed it back to the bit line pair.

For the above two reasons, speedup of read operation is difficult in the circuit configuration disclosed in Patent Document 1.

It is an objective of the present disclosure to provide a semiconductor memory device capable of achieving improvement of reliability and speedup in read operation.

A typical configuration of the present disclosure is a data transmission circuit including: a plurality of first bit lines through which data is read simultaneously; a plurality of voltage change detection circuits provided for the plurality of first bit lines; a second bit line; a plurality of selection circuits configured to select one of the plurality of first bit lines according to a first control signal and connect the selected first bit line to the second bit line; and a sense amplifier connected to the second bit line, wherein the sense amplifier is controlled by a first sense amplifier activation signal to which outputs of the plurality of voltage change detection circuits are connected.

According to the present disclosure, in a semiconductor memory device, in particular, the startup timing of the sense amplifier is determined by the outputs of a plurality of voltage change detection circuits. Thus, improvement of reliability and speedup in read operation can be achieved.

DETAILED DESCRIPTION

The present disclosure will be described hereinafter in detail in terms of preferred embodiments shown in the accompanying drawings presented, not for restricting, but for illustrating the present invention. It should be understood that, while static random access memory (SRAM) is described as an example, the present disclosure is also applicable to other fields.

First Embodiment

Figure 1:
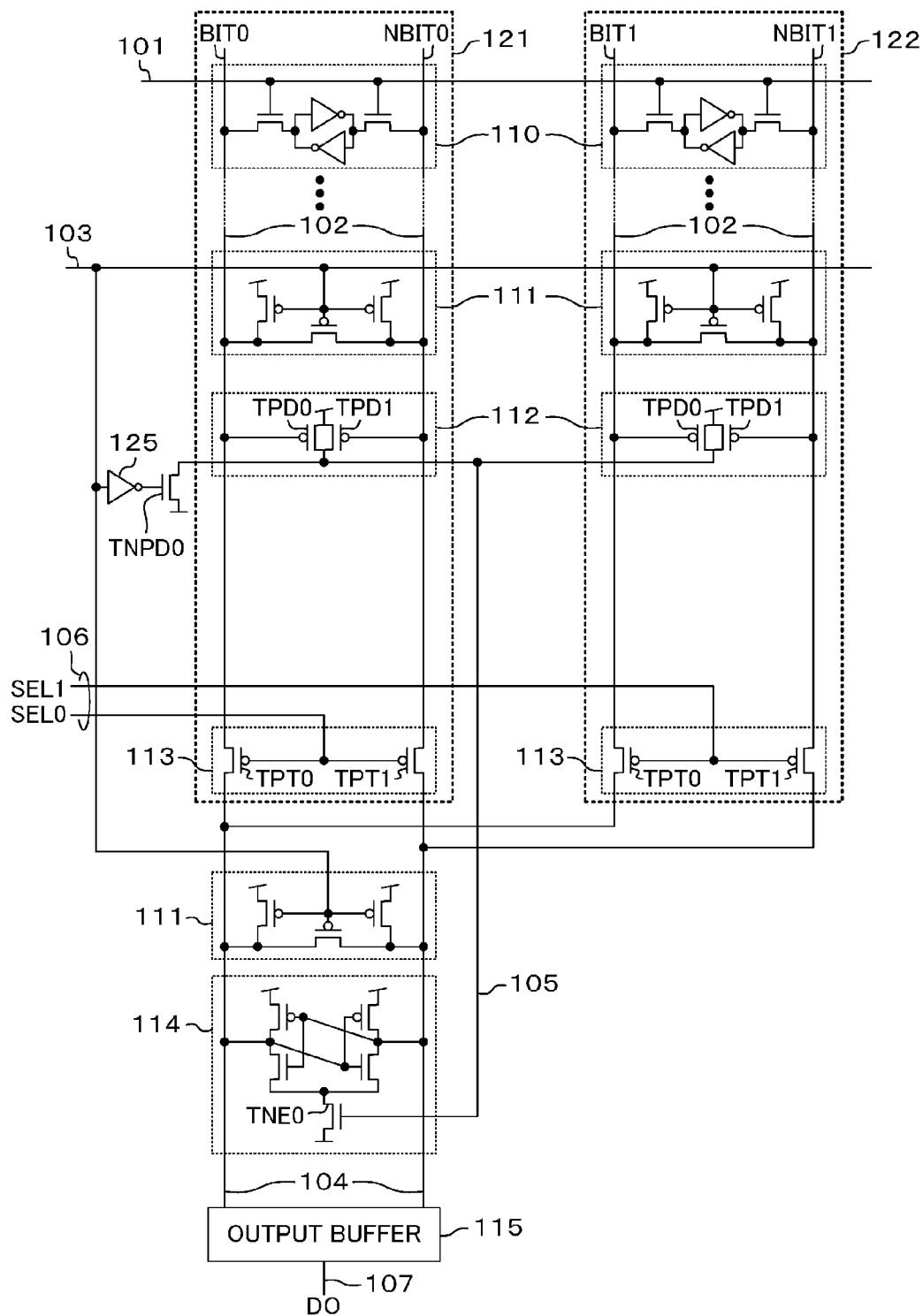
FIG. 1 is a circuit diagram of a semiconductor memory device of the first embodiment of the present disclosure.

FIG. 1 shows a circuit diagram of a semiconductor memory device of the first embodiment of the present disclosure. The outline configuration of FIG. 1 includes: two local bit line pairs 102 to each of which a plurality of memory cells 110 are connected; a voltage change detection circuit 112 provided for each local bit line pair 102; a sense amplifier activation signal 105 to which the outputs of the voltage change detection circuits 112 in a first block 121 and a second block 122 are connected; a global bit line pair 104; column selection circuits 113 that select one of the two local bit line pairs 102 according to column selection signals (SEL0 and SEL1), to connect the selected local bit line pair 102 to the global bit line pair 104; and a sense amplifier 114 provided on the global bit line pair 104. The sense amplifier 114 is controlled by the sense amplifier activation signal 105.

In the configuration of FIG. 1, the first block 121 has a pair of bit lines BIT0 and NBIT0 as the local bit line pair 102, and the second block 122 has a pair of bit lines BIT1 and NBIT1 as the local bit line pair 102. The first and second blocks 121 and 122 have a common word line 101. A precharge circuit 111 is provided for each of the plurality of local bit line pairs 102 and the global bit line pair 104, to precharge the local bit line pairs 102 and the global bit line pair 104 to high during the time when a precharge control signal 103 is kept low. The precharge control signal 103 is also supplied to the gate of an NMOS predischarge transistor TNPD0 via an inverter 125. The predischarge transistor TNPD0 is a transistor for resetting the sense amplifier activation signal 105 to low.

Each of the voltage change detection circuits 112 is constituted by PMOS detection transistors TPD0 and TPD1, and each of the column selection circuits 113 is constituted by PMOS selection transistors TPT0 and TPT1. The sense amplifier 114 has an NMOS enable transistor TNE0 on its ground side. The sense amplifier activation signal 105 is connected to the gate of the enable transistor TNE0. A minute potential difference having appeared in the global bit line pair 104 is amplified by the sense amplifier 114 and output via an output buffer 115 as output data (DO) 107.

The read operation of the circuit shown in FIG. 1 will be described. In the standby state, the precharge control signal 103 is low, and the selection transistors TPT0 and TPT1 constituting each column selection circuit 113 are on, so that the local bit line pairs 102 and the global bit line pair 104 are precharged to high by the precharge circuits 111. The sense amplifier activation signal 105 is discharged to low by the predischarge transistor TNPD0.

In the read cycle, first, the precharge control signal 103 changes from low to high, turning off the precharge circuits 111 and the predischarge transistor TNPD0. Then, with a change of the column selection signal SEL0 from high to low, the local bit line pair 102 in the selected first block 121 is connected to the global bit line pair 104 through the selection transistors TPT0 and TPT1. Thereafter, the word line 101 changes from low to high, allowing data stored in the memory cells 110 to be read therefrom to the local bit line pairs 102 in the first block 121 and the second block 122. At this time, assuming that the selection transistors TPT0 and TPT1 in the first block 121 are on while those in the second block 122 are off, the transition from high to low of the local bit line pair 102 in the first block 121 is slow because the local bit line pair 102 is connected to the global bit line pair 104. By contrast, the local bit line pair 102 in the second block 122 changes from high to low swiftly because the load capacitance is small. Once either the bit line BIT1 or NBIT1 in the second block 122 changes from high to low, dropping to near the threshold of the PMOS transistor, either the detection transistor TPD0 or TPD1 of the voltage change detection circuit 112 in the second block 122 is turned on, allowing the sense amplifier activation signal 105 to change from low to high. This turns on the enable transistor TNE0, starting the sense amplifier 114. In this way, the minute potential difference having appeared on the global bit line pair 104 is amplified and output via the output buffer 115 as the output data 107.

Advantages of the above configuration will be described. Since the voltage change is detected using the transition of the local bit line pair 102 that has not been selected and thus is small in load capacitance, the sense amplifier activation signal 105 can be activated at the time of occurrence of a minute potential difference in the local bit line pair 102 as the object to be read. It is therefore possible to configure a sense amplifier activation signal generating circuit that follows variations in the characteristics of the memory cells 110 and is less susceptible to chip in-plane variations, permitting achievement of both high reliability and high-speed read.

Also, since the sense amplifier activation signal 105 is adjusted automatically, no individual timing adjustment is necessary when semiconductor memory devices are combined by a compiler, etc., permitting reduction in the number of process steps and shortening of the development period.

Moreover, in the above configuration, since a timing circuit for the sense amplifier activation signal 105 is formed using the existing circuit resources, the area overhead is small compared with the conventional replica type.

Next, means for further enhancing the advantages described above will be described.

It is desirable that the transition of the local bit line pairs 102 be faster than that of the global bit line pair 104. To achieve this, the size of the selection transistors TPT0 and TPT1 may be reduced, to increase the resistance between the local bit line pairs 102 and the global bit line pair 104. The resistance of the selection transistors TPT0 and TPT1 weakens the connection between the load capacitance of the local bit line pairs 102 and the load capacitance of the global bit line pair 104, whereby the transition of the local bit line pairs 102 can be sped up.

Also, transistors having a low threshold may be used as the detection transistors TPD0 and TPD1, or the thresholds of the detection transistors TPD0 and TPD1 may be reduced by substrate control, whereby the voltage change in the local bit line pairs 102 can be detected early.

Moreover, the precharge voltage of the local bit line pairs 102 may be reduced, or the voltage of the local bit line pairs 102 may be reduced prior to data read, whereby the timing of detection of a voltage change in the local bit line pairs 102 by the detection transistors TPD0 and TPD1 can be advanced.

Figure 2:
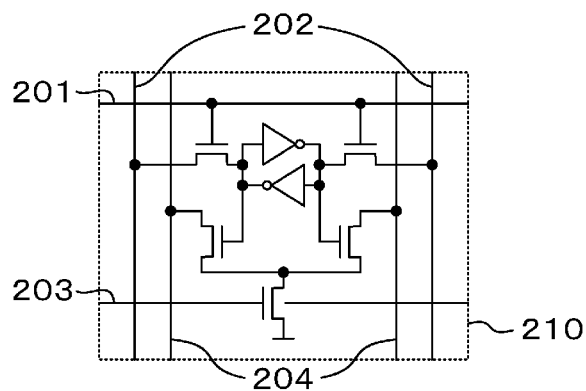
FIG. 2 is a circuit diagram showing an alternative configuration of a memory cell in FIG. 1.
Figure 3:
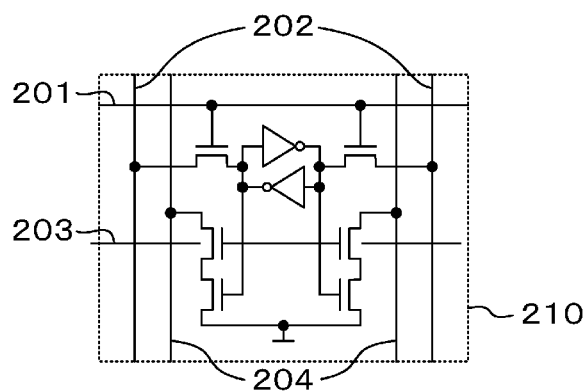
FIG. 3 is a circuit diagram showing another alternative configuration of a memory cell in FIG. 1.

In place of the type of the memory cell 110 in FIG. 1, memory cells 210 shown in FIGS. 2 and 3 may be used. In FIGS. 2 and 3, the reference character 201 denotes a write word line, 202 a write bit line pair, 203 a read word line, and 204 a read bit line pair. With the memory cells 210 shown in FIGS. 2 and 3, the transition of the read bit line pair 204, i.e., the transition of the local bit line pair 102 in FIG. 1, can be further accelerated.

Note that, although FIG. 1 shows two selection candidates, the first block 121 and the second block 122, where one block is left as the non-selected block, the number of blocks as selection candidates may be increased, to increase the number of blocks that are left non-selected during data read. This can improve the capability of driving the sense amplifier activation signal 105 and thus achieve speedup of read. When sufficient capability of driving the sense amplifier activation signal 105 is obtained by increasing the number of blocks that are left non-selected, the size of the detection transistors TPD0 and TPD1 can be reduced, and this reduces the load capacitance of the local bit line pairs 102, permitting speedup. Moreover, since data is read from a plurality of memory cells 110 simultaneously to obtain logical OR, a memory cell 110 poor in characteristics due to variations, if present, will be compensated for by another memory cell 110. Therefore, degradation in read speed due to variations can be prevented or reduced.

<First Alteration>

Figure 4:
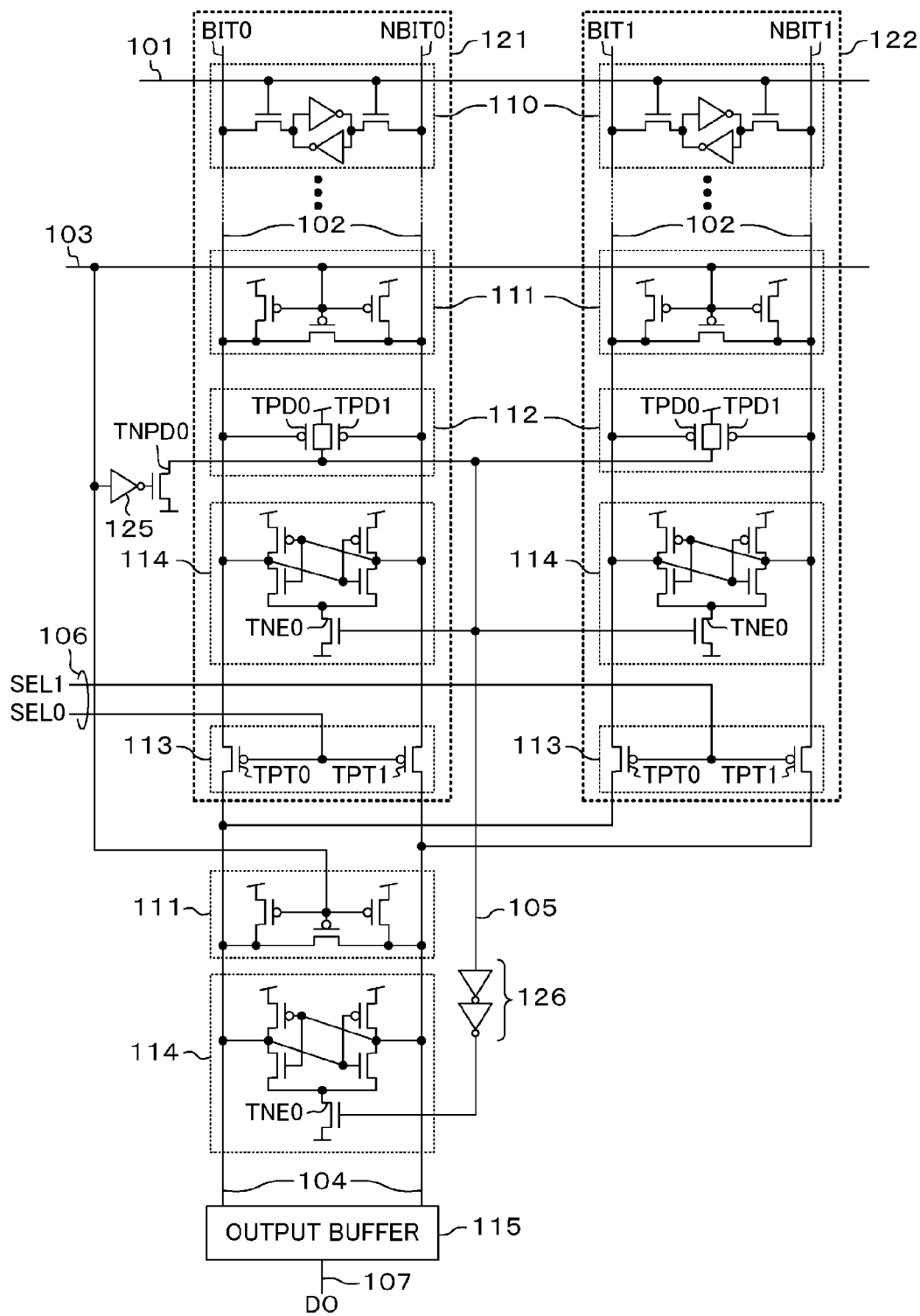
FIG. 4 is a circuit diagram of a semiconductor memory device of the first alteration.

FIG. 4 shows a circuit diagram of a semiconductor memory device of the first alteration. The configuration is different from that of FIG. 1 in that the sense amplifier 114 is also provided for the local bit line pair 102 in each of the first block 121 and the second block 122.

Also, for the sense amplifier 114 connected to the global bit line pair 104, the sense amplifier activation signal 105 is delayed by buffers 126 to permit setting of more reliable amplification timing.

A merit of this configuration is that read can be further sped up by accelerating the voltage change of the local bit line pair 102.

<Second Alteration>

Figure 5:
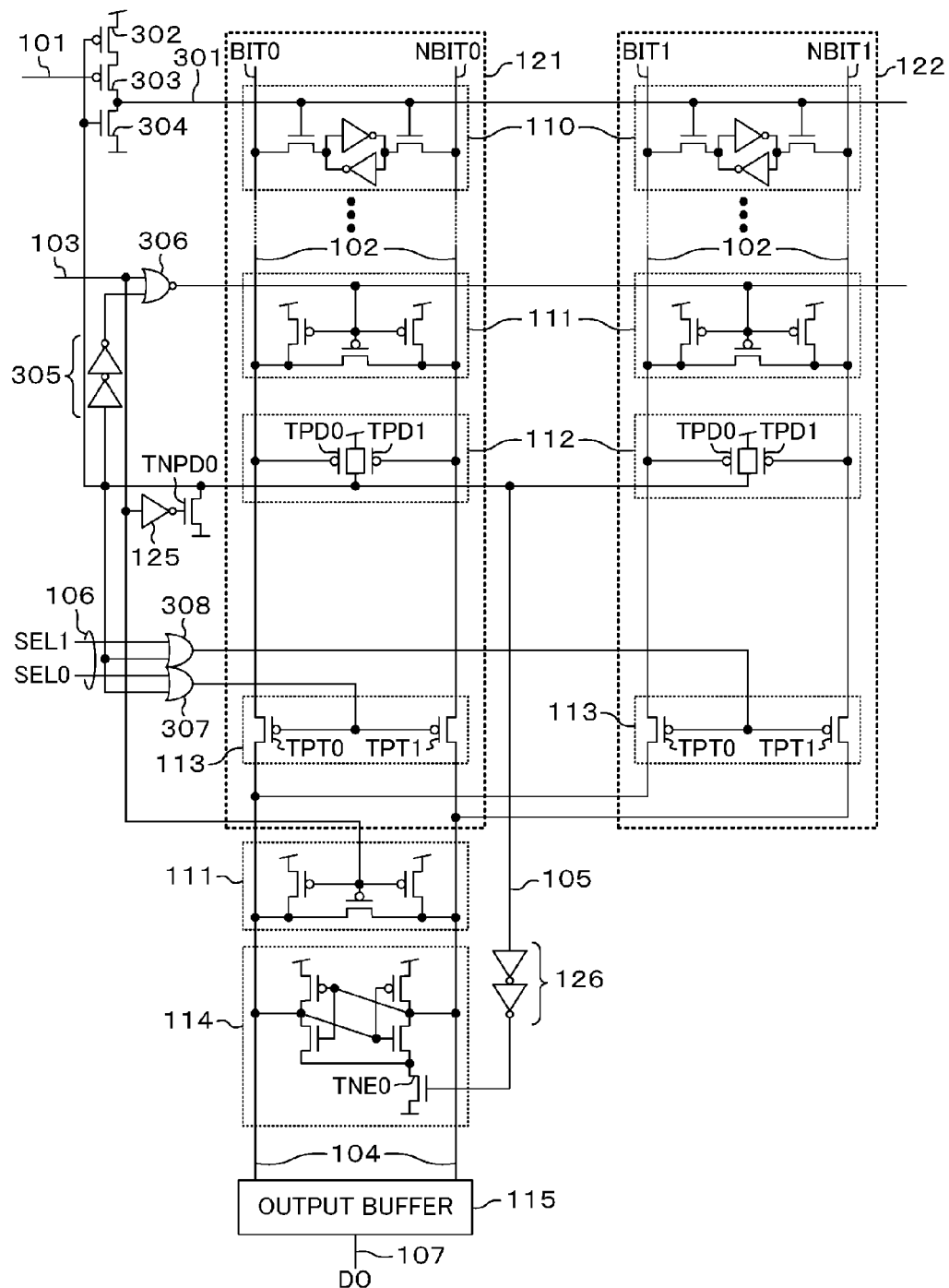
FIG. 5 is a circuit diagram of a semiconductor memory device of the second alteration.

FIG. 5 shows a circuit diagram of a semiconductor memory device of the second alteration. The configuration is different from that of FIG. 1 in that the precharge circuits 111 and the column selection circuits 113 for the local bit line pairs 102 are controlled by the sense amplifier activation signal 105. Also, read from the memory cells 110 is controlled by the sense amplifier activation signal 105.

Specifically, a local word line 301 is commonly connected to a plurality of memory cells 110. Two PMOS transistors 302 and 303 and one NMOS transistor 304 connected serially are interposed between the word line 101 and the local word line 301. Having this configuration, while the logic of the word line 101 is transferred to the local word line 301 during the time when the sense amplifier activation signal 105 is low, the local word line 301 is kept low after transition of the sense amplifier activation signal 105 from low to high. Also, a NOR gate 306 receives the precharge control signal 103 and the sense amplifier activation signal 105 via buffers 305, and the precharge circuits 111 for the local bit line pairs 102 is controlled by the output of the NOR gate 306. Moreover, NOR gates 307 and 308 each receive the column selection signal 106 and the sense amplifier activation signal 105, and the column selection circuits 113 are controlled by the outputs of the OR gates 307 and 308.

Merits of the configuration of FIG. 5 are as follows. Immediately after transfer of a voltage change of the local bit line pair 102 selected by the column selection circuit 113 to the global bit line pair 104, or immediately after startup of the sense amplifier 114 for the global bit line pair 104, the connection between the local bit line pair 102 and the global bit line pair 104 is cut off. This reduces the load of the global bit line pair 104, permitting speedup of the transition of the global bit line pair 104.

Also, immediately after the disconnection of the local bit line pair 102 from the global bit line pair 104, the local word line 301 is deactivated, to permit start of precharge of the local bit line pairs 102. Therefore, a long precharge period can be secured, and this permits support for high-frequency operations. Alternatively, if the cycle time is affordable, the transistor size of the precharge circuits 111 may be reduced, to reduce the area, and also reduce the load of the local bit line pairs 102 to achieve speedup of read. It is also possible to suppress or reduce increase in power consumption that may occur by useless charging/discharging of the local bit line pairs 102.

In general, the timing of the sense amplifier activation signal is designed based on the device worst conditions, and simultaneously with the activation of the sense amplifier at the timing when a given potential difference has occurred in the local bit line pair, the local bit line pair is disconnected from the global bit line pair. This is intended to speed up the global bit line pair and, at the same time, reduce power consumption by avoiding the local bit line pair from being amplified completely. However, under the device best conditions, the local bit line pair is amplified completely by a memory cell by the time when the sense amplifier activation signal is activated, increasing the charge/discharge current for the local bit line pair. In this alteration, the voltage change detection circuit 112 detects a change in the voltage of the local bit line pair 102 under the device best conditions, and thus complete amplification of the local bit line pair 102 can be suppressed or reduced, permitting reduction in power consumption.

Note that, in the alteration of FIG. 5, the sense amplifier 114 is provided for the global bit line pair 104. Alternatively, the sense amplifier 114 may also be provided for each local bit line pair 102. In this case, speedup can be achieved as described with reference to FIG. 4.

<Third Alteration>

Figure 6:
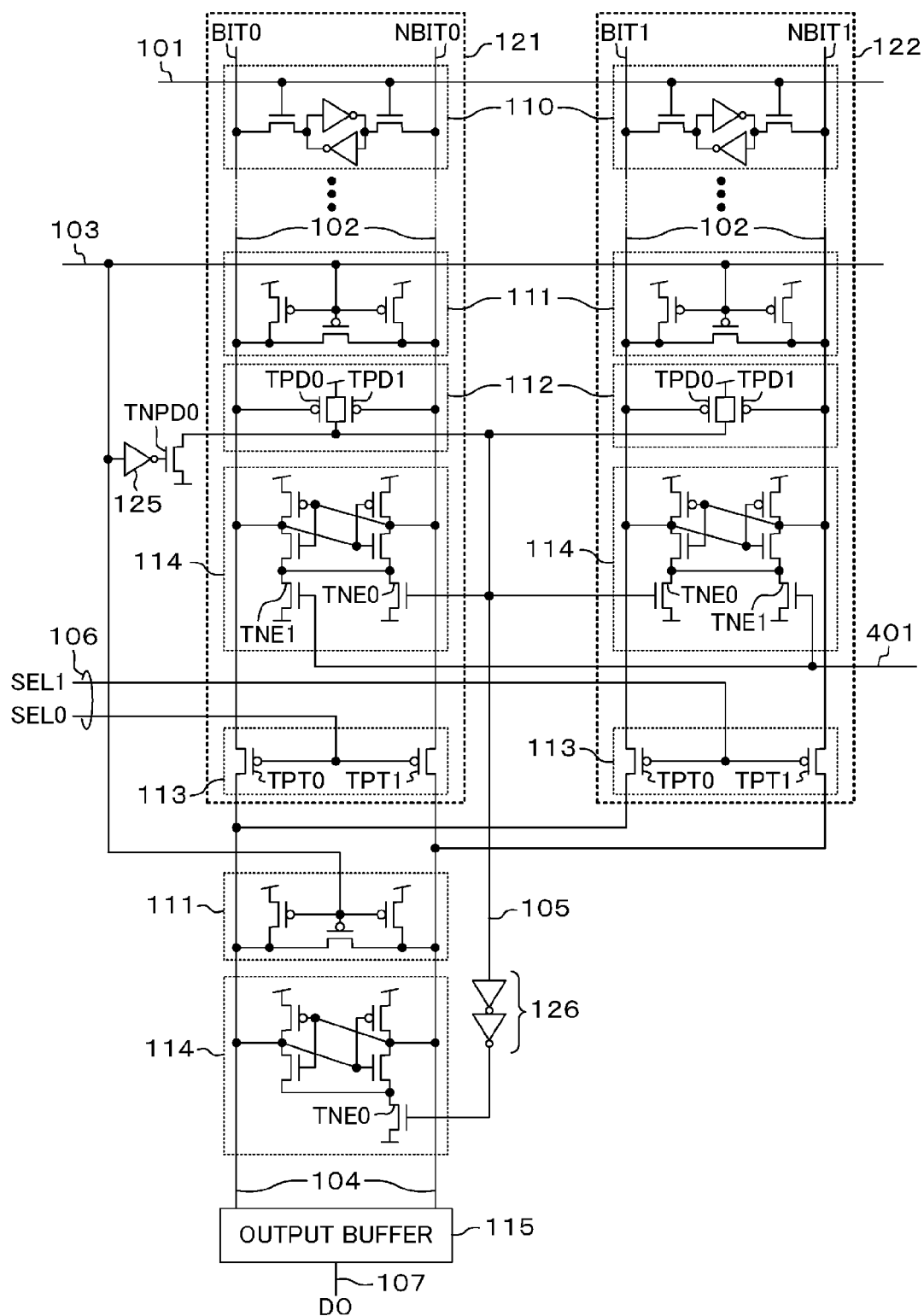
FIG. 6 is a circuit diagram of a semiconductor memory device of the third alteration.

FIG. 6 shows a circuit diagram of a semiconductor memory device of the third alteration. The configuration is different from that of FIG. 4 in that a sense amplifier forced activation transistor TNE1 that is turned on when receiving a high sense amplifier forced activation signal 401 is connected to the sense amplifier 114 for each local bit line pair 102.

Having this configuration, while the sense amplifier 114 is started by the sense amplifier forced activation signal 401 for high-speed read under the device worst conditions, it is started by the output of the voltage change detection circuit 112 under the device best conditions. In this way, both speedup under the worst conditions and low power consumption under the best conditions can be achieved.

In the conventional configuration, when the timing of the sense amplifier forced activation signal 401 is determined based on high-voltage, high-speed operation, erroneous read may occur under low voltage because the timing of the signal 401 is too early. In this configuration, however, while the sense amplifier 114 is started by the sense amplifier forced activation signal 401 under high voltage, it is started by the output of the voltage change detection circuit 112 under low voltage. Therefore, both high-speed, high-voltage operation and low-speed, low-voltage operation can be achieved. In relation to this, some means may be used to prevent the sense amplifier forced activation signal 401 from being activated under low voltage, including using a low-voltage mode control signal and using a feedback circuit in a circuit for generating the sense amplifier forced activation signal 401 to ensure prevention of the signal 401 from being activated under low voltage.

Also, in this configuration, on the premise of limiting the use to low-speed operation, the sense amplifier forced activation signal 401 may be permanently deactivated by a relief signal, so that problems caused by the too early timing of the sense amplifier forced activation signal 401 can be solved.

Alternatively, the sense amplifier forced activation signal 401 may be activated during write, to permit use of the sense amplifier 114 as an assist to a write circuit. This can improve the write speed, or reduce the area by reducing the transistor size of the write circuit. In this case, by using a voltage less than the ground level as the power supply to the source of the sense amplifier forced activation transistor TNE1, the write characteristics can be improved. Otherwise, by driving the sense amplifier forced activation signal 401 by a high voltage, also, the write characteristics can be improved. It is therefore possible to achieve increase in write speed, or reduction in area and load capacitance due to a reduced size of write transistors.

Note that, in the alteration of FIG. 6, although the sense amplifier forced activation signal 401 is connected to only the sense amplifiers 114 for the local bit line pairs 102, it can also be connected to the sense amplifier 114 for the global bit line pair 104. The sense amplifier 114 for the global bit line pair 104 can be controlled at timing different from the startup of the sense amplifiers 114 for the local bit line pairs 102. An equivalent effect can also be obtained by connecting the sense amplifier forced activation transistor TNE1 to the sense amplifier 114 for the global bit line pair 104 in FIG. 1.

<Fourth Alteration>

Figure 7:
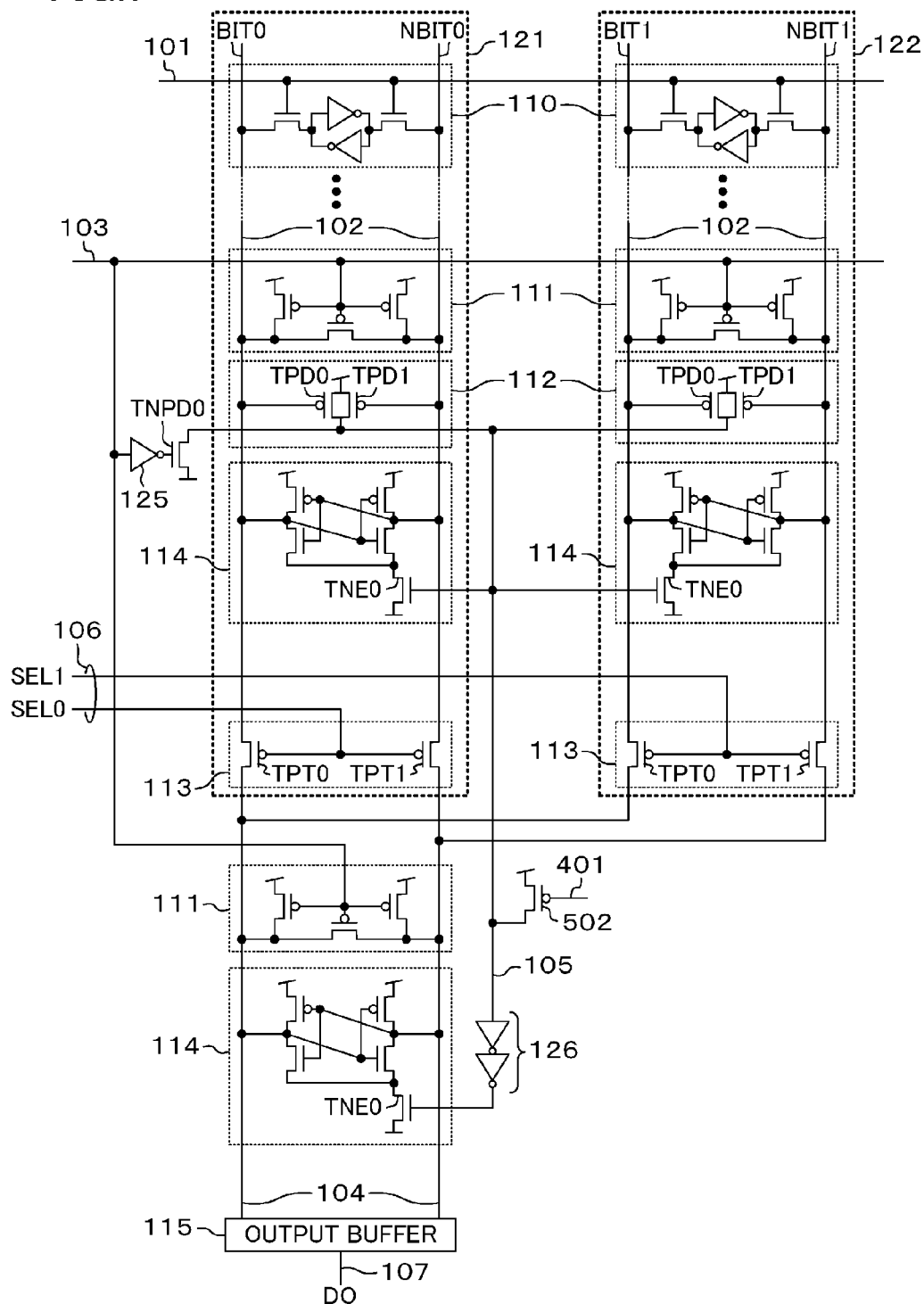
FIG. 7 is a circuit diagram of a semiconductor memory device of the fourth alteration.

FIG. 7 shows a circuit diagram of a semiconductor memory device of the fourth alteration. The configuration is different from that of FIG. 6 in that the sense amplifier forced activation signal 401 is connected, not to the sense amplifiers 114, but to the sense amplifier activation signal 105 through a PMOS transistor 502.

In the configuration of FIG. 7, the number of elements is small compared with the circuit of FIG. 6, permitting reduction in area.

<Fifth Alteration>

Figure 8:
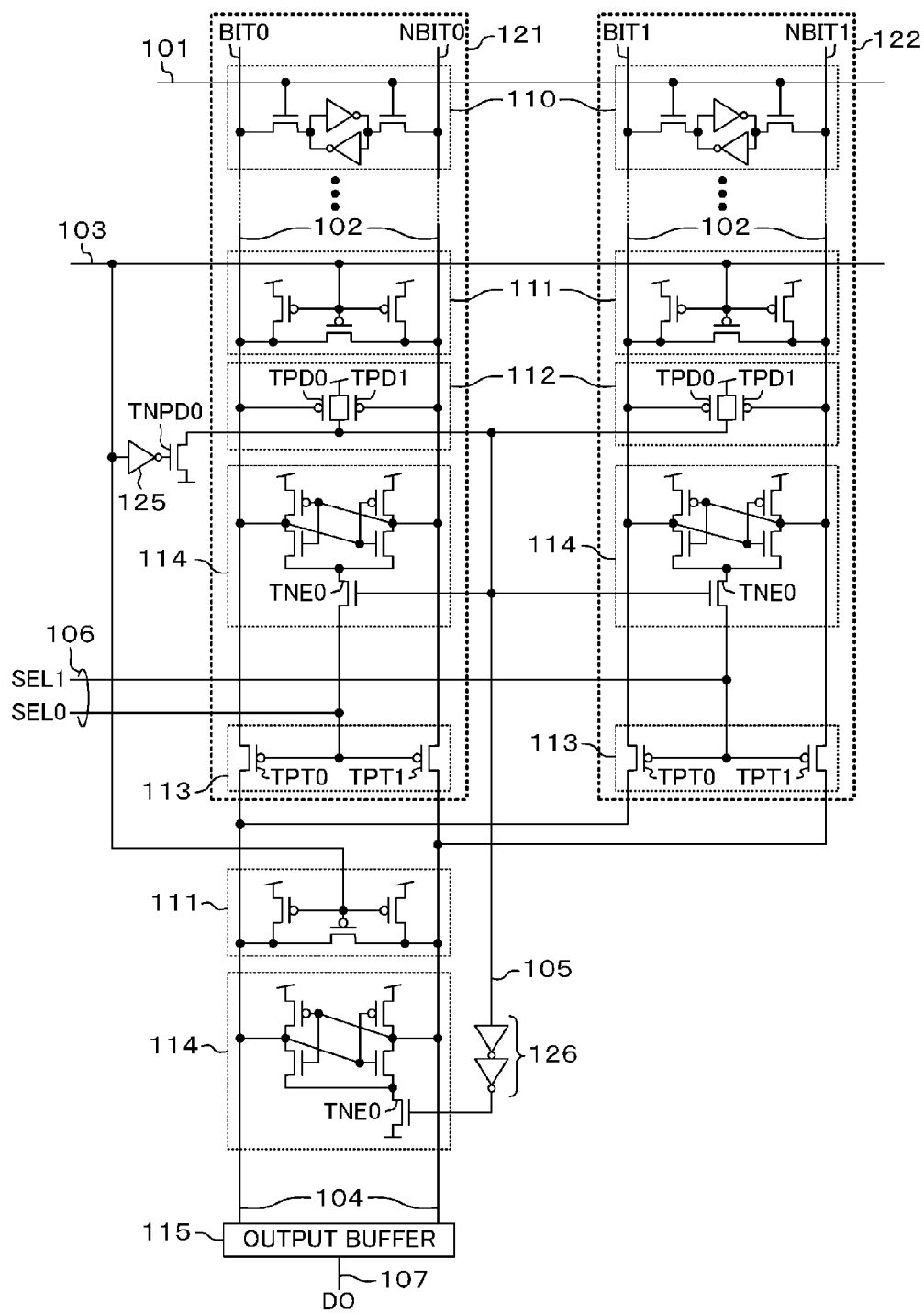
FIG. 8 is a circuit diagram of a semiconductor memory device of the fifth alteration.

FIG. 8 shows a circuit diagram of a semiconductor memory device of the fifth alteration. The configuration is different from that of FIG. 7 in that the column selection signals SEL0 and SEL1 are connected to the enable transistors TNE0 that activate the sense amplifiers 114 for the local bit line pairs 102.

This configuration can suppress or reduce useless charging/discharging of the non-selected column during read or write, permitting reduction in power consumption.

Further, the configuration of FIG. 8 can be implemented with no addition of transistors to the configuration of FIG. 7, and thus reduction in area can be achieved.

<Sixth Alteration>

Figure 9:
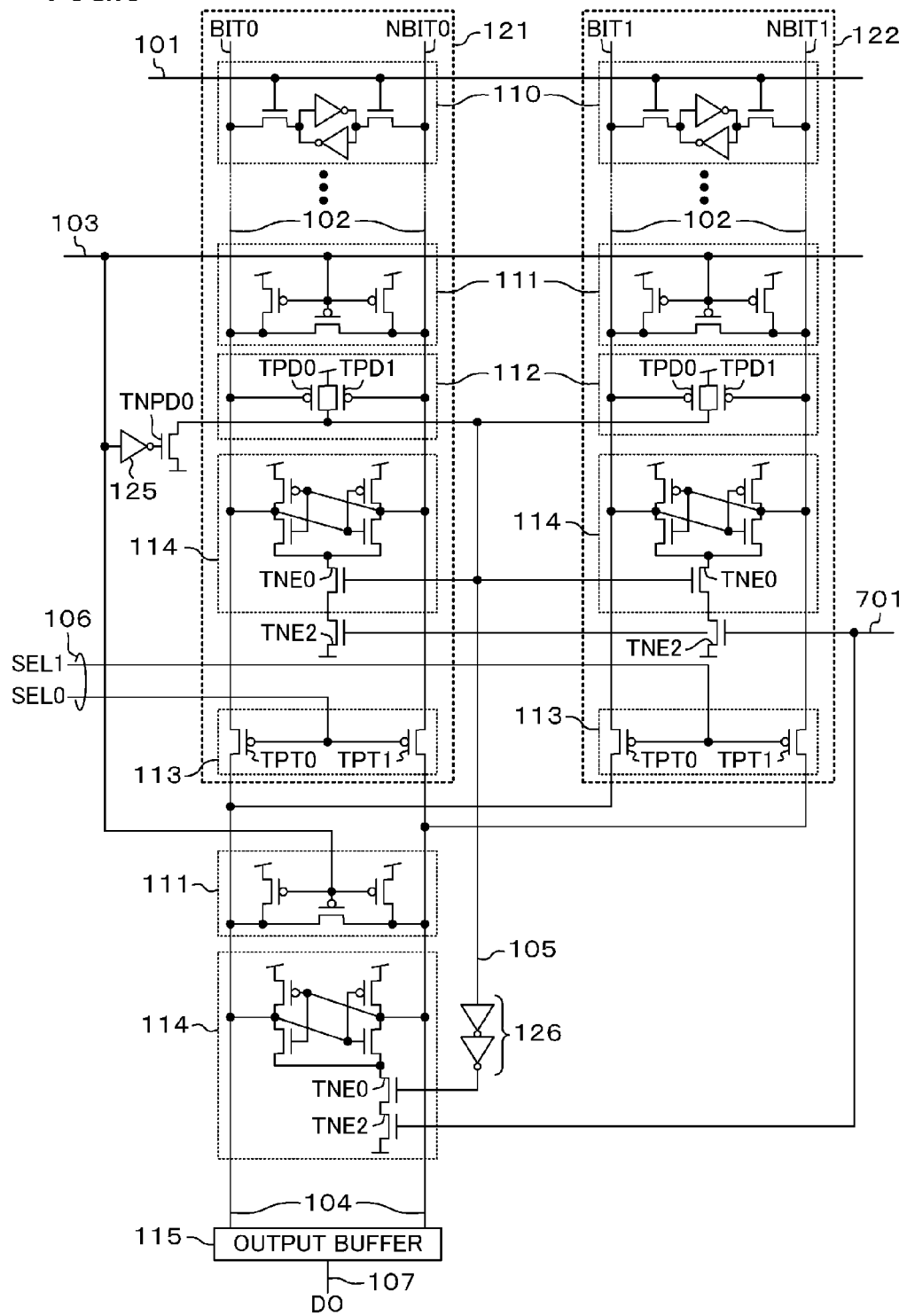
FIG. 9 is a circuit diagram of a semiconductor memory device of the sixth alteration.

FIG. 9 shows a circuit diagram of a semiconductor memory device of the sixth alteration. The configuration is different from that of FIG. 8 in that a sense amplifier forced deactivation transistor TNE2 that is turned on when receiving a high sense amplifier forced deactivation signal 701 is connected to the source of the enable transistor TNE0 of each of the sense amplifiers 114 connected to the local bit line pairs 102 and the global bit line pair 104.

In the above configuration, startup of the sense amplifiers 114 during write can be prevented. Also, the timing at which the sense amplifier forced deactivation signal 701 is activated may be retarded when the detection by the voltage change detection circuit 112 is fast causing shortage in the margin of the sense amplifier startup timing, to avoid problems related to the startup timing of the sense amplifiers 114.

<Seventh Alteration>

Figure 10:
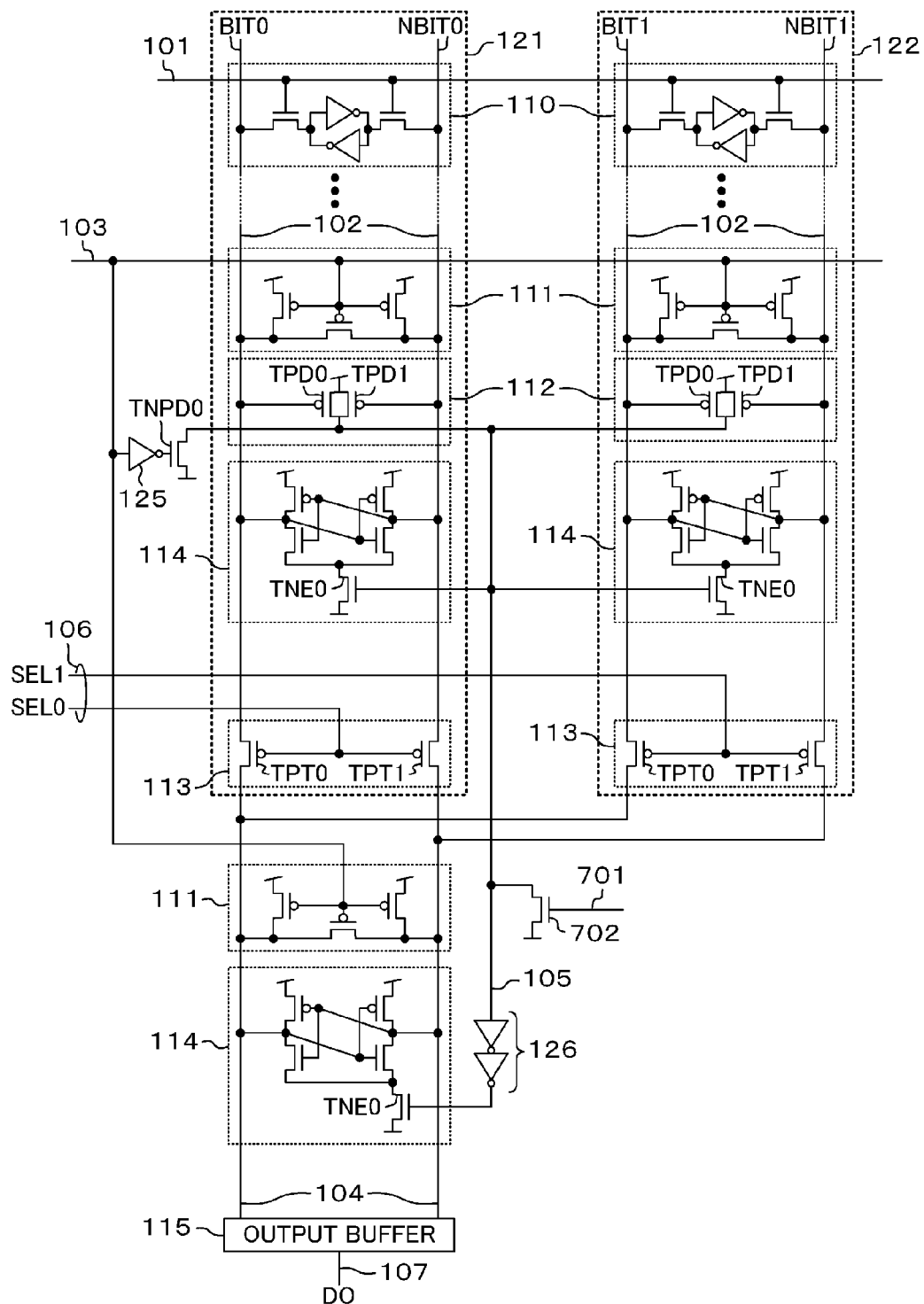
FIG. 10 is a circuit diagram of a semiconductor memory device of the seventh alteration.

FIG. 10 shows a circuit diagram of a semiconductor memory device of the seventh alteration. The configuration is different from that of FIG. 9 in that the sense amplifier forced deactivation signal 701 is connected, not to the sense amplifiers 114, but to the sense amplifier activation signal 105 through an NMOS transistor 702.

In the above configuration, the number of elements can be reduced compared with the configuration of FIG. 9, permitting reduction in area. Also, since the number of drawing transistors connected in series in each sense amplifier 114 is small, the amplification speed after startup of the sense amplifier 114 is improved, and thus speedup can be achieved.

Second Embodiment

Figure 11:
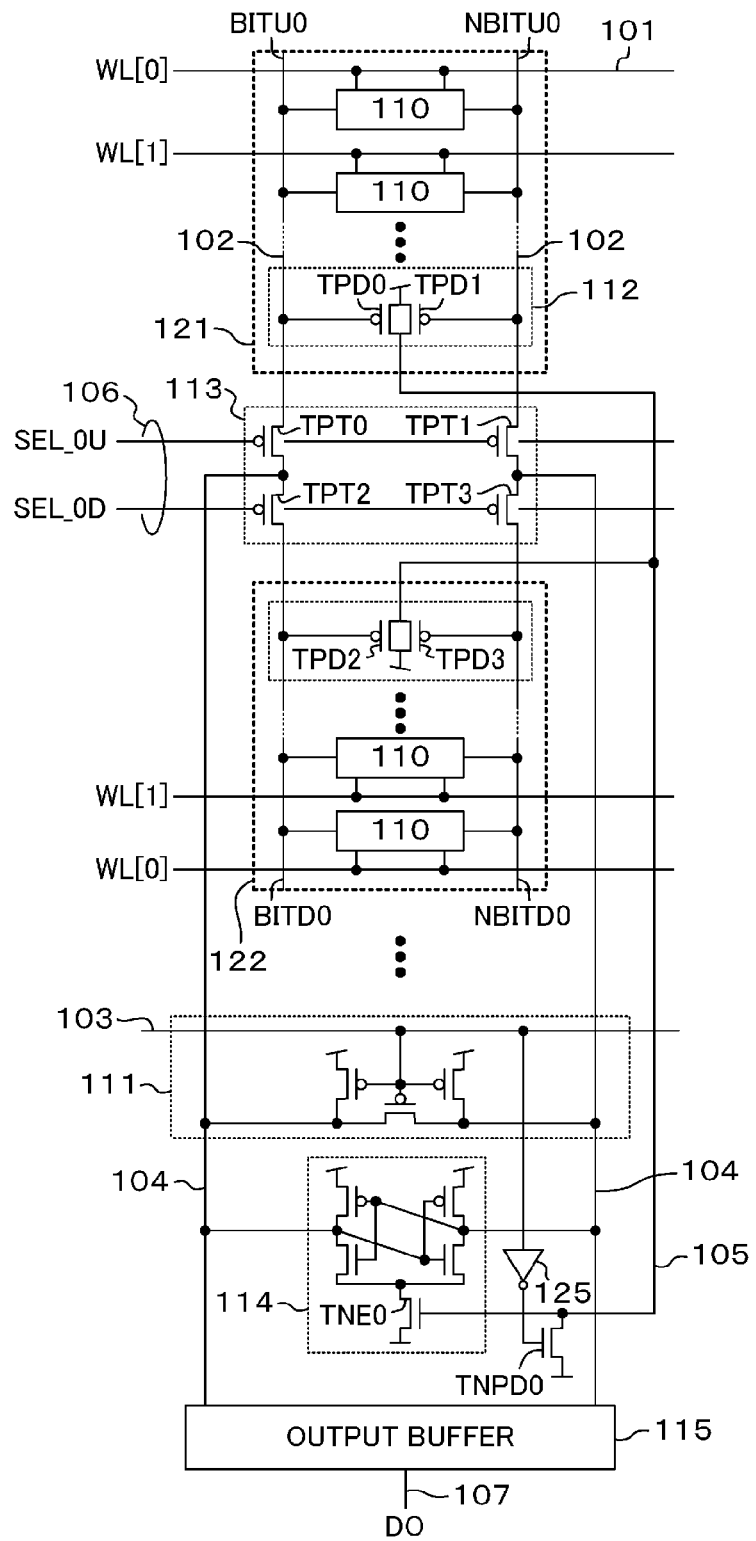
FIG. 11 is a circuit diagram of a semiconductor memory device of the second embodiment of the present disclosure.

FIG. 11 shows a circuit diagram of a semiconductor memory device of the second embodiment of the present disclosure. In the configuration of FIG. 11, a plurality of local bit line pairs (BITU0/NBITU0 and BITD0/NBITD0) 102 connected to a same bank selection circuit 113 are continuous in the direction parallel to these local bit line pairs 102.

The circuit configuration of FIG. 11 is different from that of FIG. 4 in that a plurality of local bit line pairs 102 for memory cells 110 to which common word lines (WL[0] and WL[1]) 101 are connected for simultaneous read are placed adjacent to each other in the bit line direction, and the column selection signals (SEL0 and SEL1) 106 and the column selection circuits 113 in FIG. 4 are respectively replaced with bank selection signals (SEL_0U and SEL_0D) 106 and a bank selection circuit 113 in FIG. 11. In FIG. 11, TPT0, TPT1, TPT2, and TPT3 denote selection transistors, and TPD0, TPD1, TPD2, and TPD3 denote detection transistors.

Merits of the configuration of FIG. 11 are as follows. Since the U bit and the D bit can share the sense amplifier 114, reduction in area can be achieved. Also, since wiring in the word line direction can be reduced compared with the configuration of FIG. 4, the capacitance of the global bit line pair 104 can be reduced, permitting speedup.

Moreover, in the configuration of FIG. 11, where one memory cell 110 connected to the local bit line pair 102 is selected by the combination of the word line 101 and the bank selection signal 106, the decoding logic is divided between the word line 101 and the bank selection signal 106. Thus, the logic of the word line 101 is alleviated, achieving speedup.

Furthermore, with reduction in the number of memory cells 110 connected to the local bit line pair 102 and the alleviation of the decoding logic of the word line 101 by the logic of the bank selection signal 106, activation of the word line 101 and transition of the local bit line pair 102 can be accelerated.

In addition, by determining the bank selection signal 106 at the time of occurrence of some degree of a voltage change in the local bit line pair 102, the time allocation among the word line activation time, the time of change of the local bit line pair, and the bank selection signal activation time can be optimized, permitting speedup of read operation.

Third Embodiment

Figure 12:
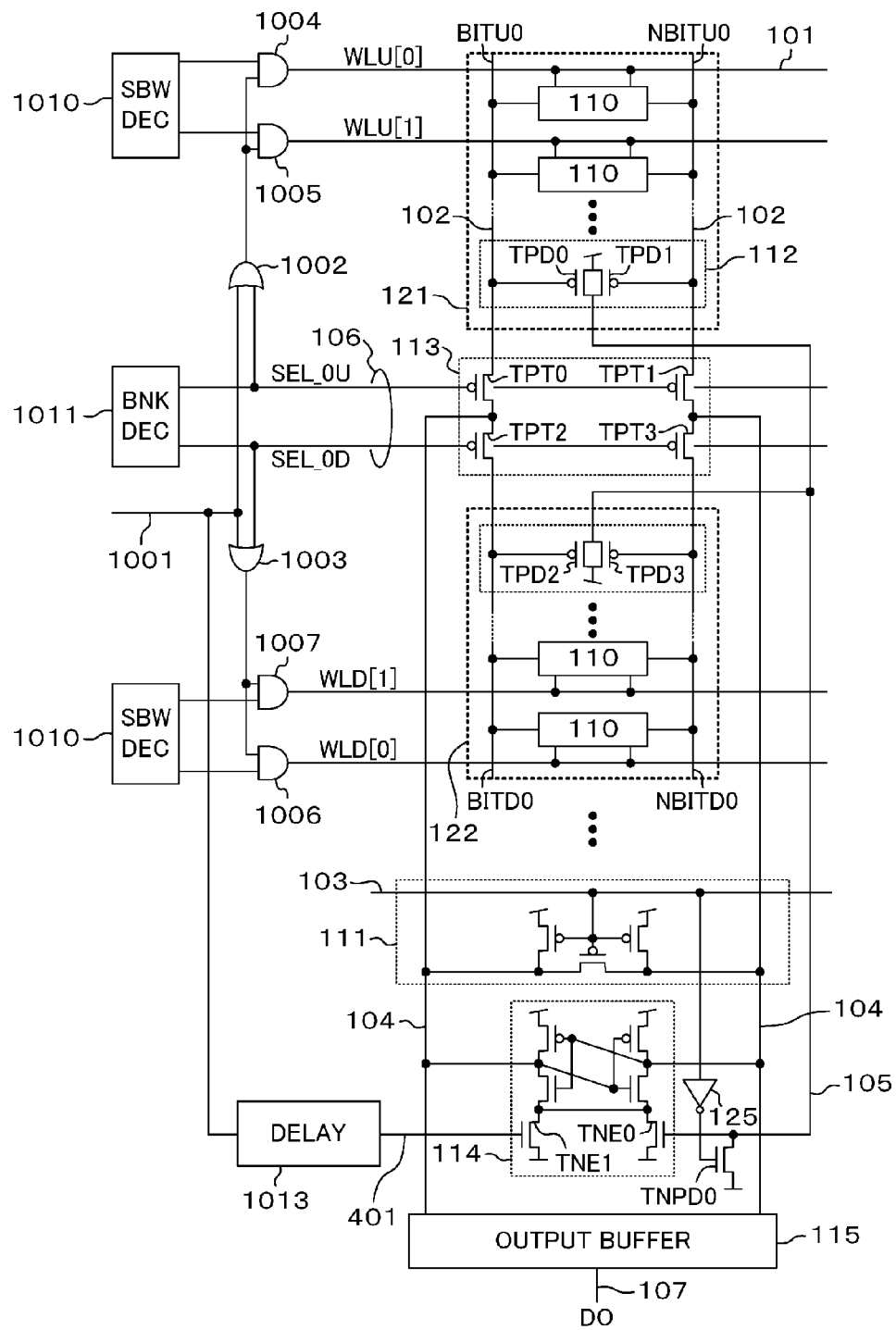
FIG. 12 is a circuit diagram of a semiconductor memory device of the third embodiment of the present disclosure.

FIG. 12 shows a circuit diagram of a semiconductor memory device of the third embodiment of the present disclosure. In FIG. 12, the reference character 1001 denotes a low-power operation control signal, 1002 and 1003 OR gates, 1004, 1005, 1006, and 1007 AND gates, 1010 a sub-bank word decoder (SBWDEC), 1011 a bank decoder (BNKDEC), 1013 a delay circuit, and WLU[0], WLU[1], WLD[0], and WLD[1] word lines.

According to the configuration of FIG. 12, while an operation similar to that in the configuration of FIG. 11 is performed when the low-power operation control signal 1001 is low, only word lines in the selected sub-bank are activated when the signal 1001 is high. Therefore, since the local bit line pair 102 in the non-selected sub-bank is not charged/discharged, low power consumption can be achieved. Although the drive capability of the sense amplifier activation signal 105 decreases with decrease in the number of local bit line pairs 102 involved in simultaneous read, this problem can be solved by placing a sense amplifier forced activation transistor TNE1 receiving the sense amplifier forced activation signal 401 of which the activation timing is controlled by the delay circuit 1013.

Note that, although one of the first and second blocks 121 and 122 is involved in simultaneous read in FIG. 12, the number of sub-banks involved in simultaneous read is not limited to one in the present disclosure.

Although the low-power operation control signal 1001 is a dynamically changing signal in the above description, it can also be used as a fixed input signal.

Fourth Embodiment

Figure 13:
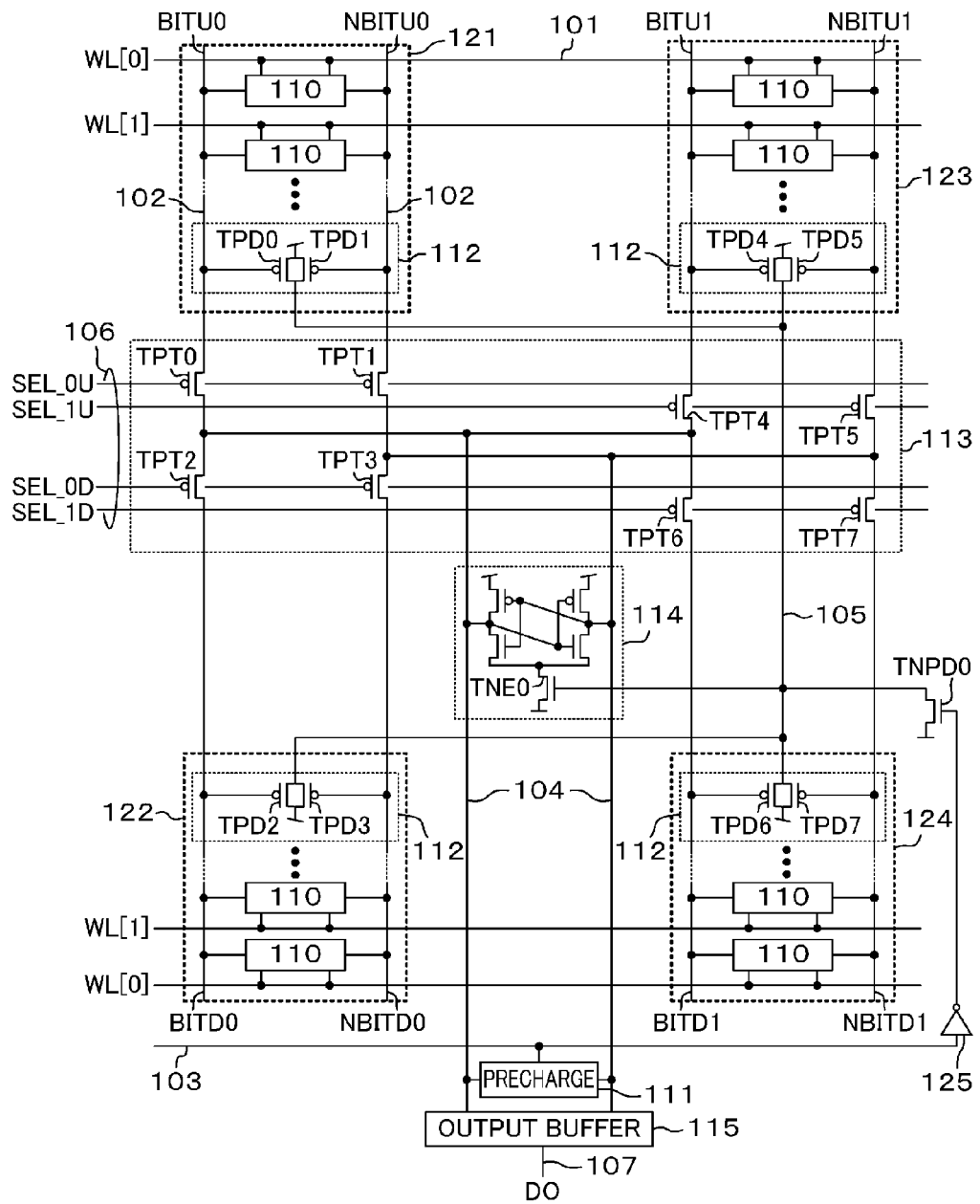
FIG. 13 is a circuit diagram of a semiconductor memory device of the fourth embodiment of the present disclosure.

FIG. 13 shows a circuit diagram of a semiconductor memory device of the fourth embodiment of the present disclosure. In FIG. 13, the sense amplifier 114 shared by four sub-blocks 121, 122, 123, and 124 adjacent in the column and row directions is controlled by the voltage change detection circuits 112 provided in the sub-blocks 121-124. In FIG. 13, BITU0/NBITU0, BITD0/NBITD0, BITU1/NBITU1, and BITD1/NBITD1 denote local bit line pairs, SEL_0U, SEL_0D, SEL_1U, and SEL_1D bank selection signals, TPT0, TPT1, TPT2, TPT3, TPT4, TPT5, TPT6, and TPT7 selection transistors, and TPD0, TPD1, TPD2, TPD3, TPD4, TPD5, TPD6, and TPD7 detection transistors.

In the configuration of FIG. 13, combined advantages of the configurations of FIG. 1 and FIG. 11 can be expected. Also, since the distance between each of the four adjacent sub-blocks 121-124 and the sense amplifier 114 is fixed, the wiring load of the sense amplifier activation signal 105 can be reduced, permitting speedup.

Fifth Embodiment

Figure 14:
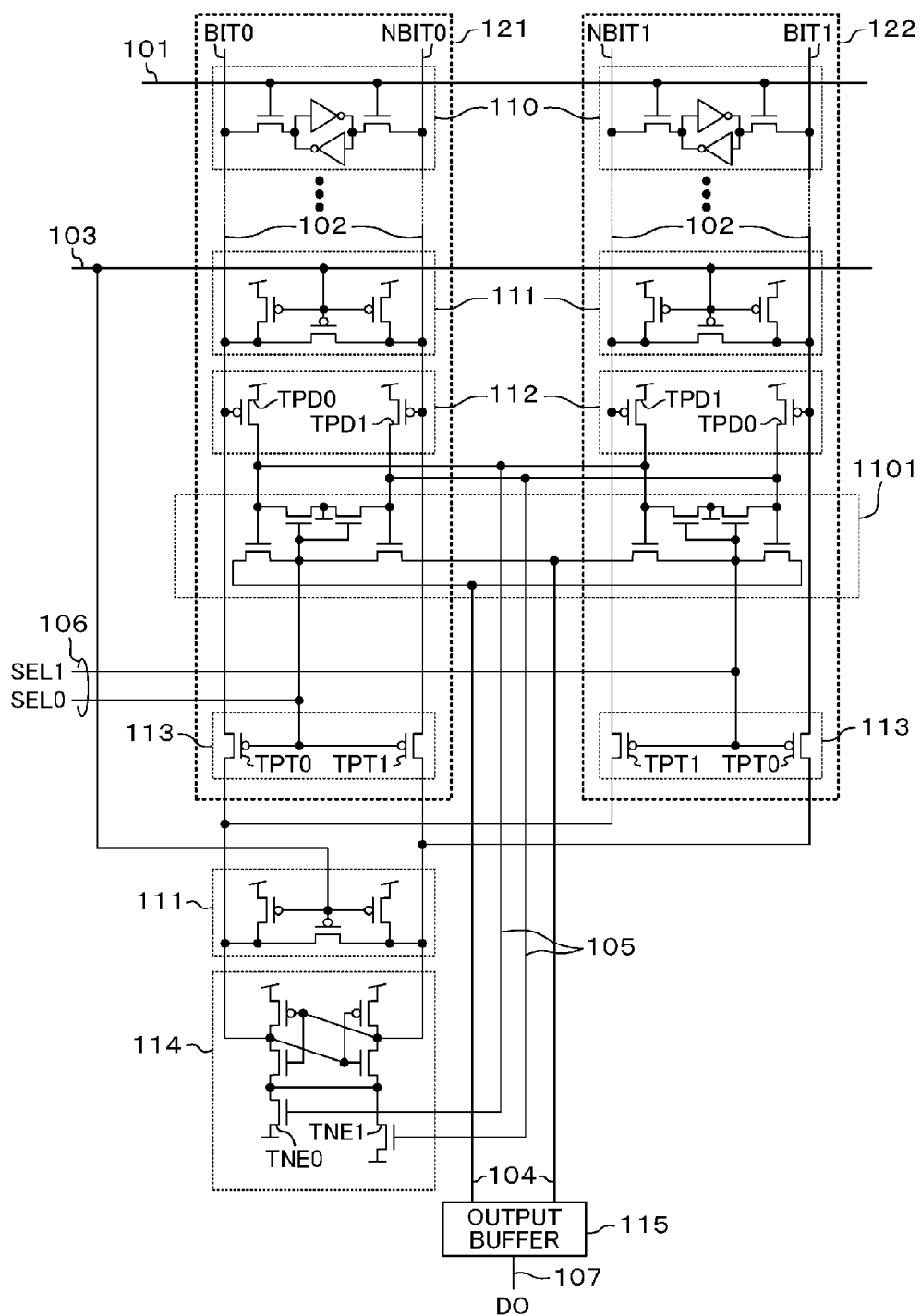
FIG. 14 is a circuit diagram of a semiconductor memory device of the fifth embodiment of the present disclosure.

FIG. 14 shows a circuit diagram of a semiconductor memory device of the fifth embodiment of the present disclosure. The configuration of FIG. 14 is different from that of FIG. 1 in that a second column selection circuit 1101 selects one of the outputs of the voltage change detection circuits 112 according to the column selection signals 106, to connect the selected signal to the global bit line pair 104. With this configuration, the transition of the global bit line pair 104 can be sped up compared with the case of using only the sense amplifier 114.

In the semiconductor memory devices shown in FIGS. 1-14, the operating current values for memory cells in memory blocks including local bit line pairs connected to the same sense amplifier via corresponding column selection circuits may be changed every memory block, so that the read speed, the power consumption, and the area can be optimized according to the required read speed values of the bits and the physical positions of the memory blocks. For example, while read of a bit requiring high-speed read and read from a memory block distant from the output terminal are sped up, the area and power consumption may be reduced for a memory block requiring no speedup. Examples of means for providing variations in operating current value include changing the shape of memory cells, changing the material of the memory cells, and changing the proportion of atoms included in the diffusion layers of transistors constituting the memory cells.

Figure 15:
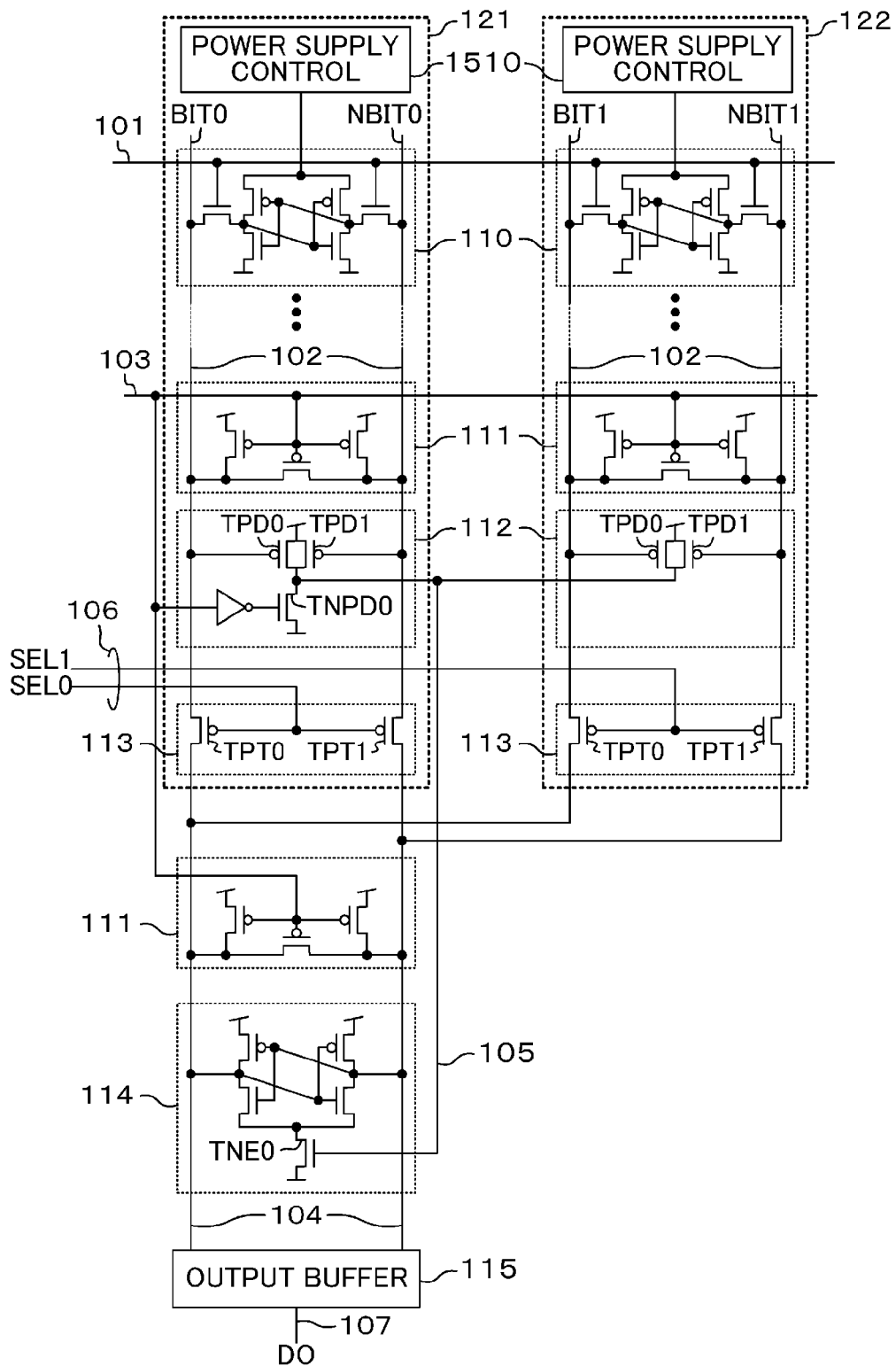
FIG. 15 is a circuit diagram showing a first example of power supply control in the semiconductor memory device of FIG. 1.

Further, as shown in FIG. 15, a power supply control circuit 1510 may be provided for each memory block to control the power supply for the memory cells 110 in each of the memory blocks 121 and 122. By this configuration, as in the configuration described above, the read speed, the power consumption, and the area can be optimized according to the required read speed values of the bits and the physical positions of the memory blocks. Compared with the method of providing variations in the operating current value for memory cells, this method of providing the power supply control circuit 1510 for each memory block has merits such as that adjustment is easy at the time of finalization of correct required values for each bit upon determination of the floor plan of the chip, and that adjustment after fabrication of the chip is possible.

Figure 16:
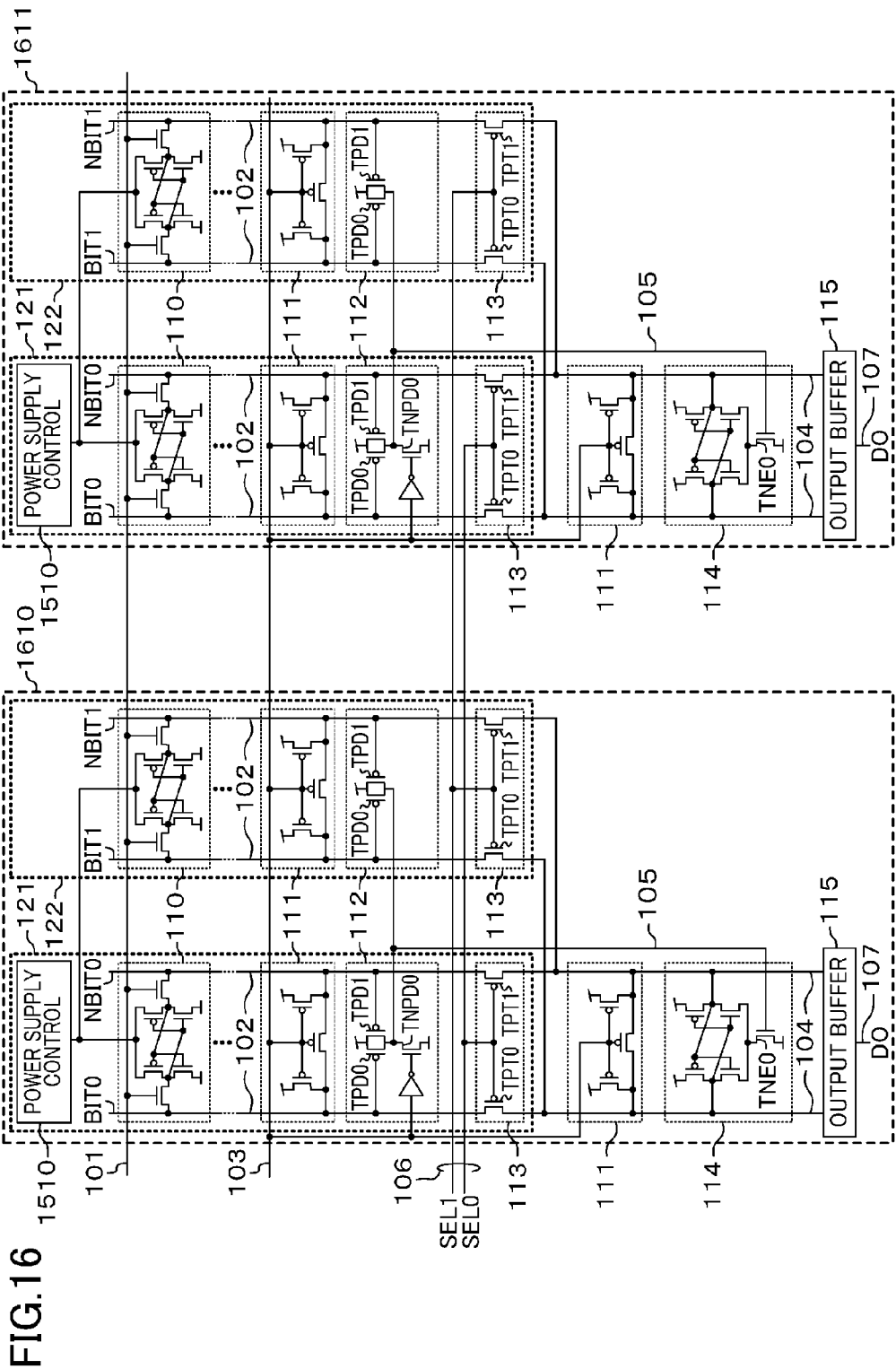
FIG. 16 is a circuit diagram showing a second example of power supply control in the semiconductor memory device of FIG. 1.

As another example, as shown in FIG. 16, a power supply control circuit 1510 may be shared by memory cells 110 in each of bit blocks 1610 and 1611 connected to the same output terminal, whereby the read speed can be adjusted for each output signal. Also, the area can be reduced compared with the case of providing the power supply control circuit 1510 for each of the memory blocks 121 and 122.

The shape of the memory cells 110 may be different every memory block or bit block. For example, the gate width or gate length of corresponding transistors may be different between the memory cells 110 in the first block 121 and those in the second block 122. Also, the transistors in each memory cell 110 are not necessarily required to be the same in gate width or gate length.

Although the unit by which the memory cells are changed and by which the power supply control circuit is provided is the memory block or the bit block in the above description, other variations are possible.

The configurations of the memory cells 210 shown in FIGS. 2 and 3 in the first embodiment of the present disclosure are also usable in the first to seventh variations and the second to fifth embodiments. Also, the components in the embodiments and the variations may be combined freely within the scope not departing from the gist of the present invention.

As described above, in the semiconductor memory device of the present disclosure, which can automatically adjust the startup timing of the sense amplifier in response to a voltage change in the bit line pair, the sense amplifier can be started with a minimum margin, permitting improvement of reliability, speedup, and low power consumption in the read operation. Also, since it is ensured that the sense amplifier can be started at safe timing even at occurrence of device variations and voltage variations, a wide operation range can be secured. Moreover, adjustment of the startup timing of the sense amplifier is unnecessary for a memory expanded by a compiler, permitting reduction in the number of process steps. Furthermore, since no timing generation circuit is necessary for generating the startup timing of the sense amplifier, the area can be reduced. The present disclosure is applicable, not only to bit lines of semiconductor memory devices, but also to various types of data transmission circuits having data line pairs.

What is claimed is:

1. A data transmission circuit, comprising:
   a plurality of first bit lines through which data is read simultaneously;
   a plurality of voltage change detection circuits provided for the plurality of first bit lines;
   a second bit line;
   a plurality of selection circuits configured to select one of the plurality of first bit lines according to a first control signal and connect the selected first bit line to the second bit line; and
   a sense amplifier connected to the second bit line, wherein
   the sense amplifier is controlled by a first sense amplifier activation signal to which outputs of the plurality of voltage change detection circuits are connected.

2. The data transmission circuit of claim 1, further comprising:
   a plurality of local sense amplifiers provided for the plurality of first bit lines and controlled by the first sense amplifier activation signal.

3. The data transmission circuit of claim 2, wherein
   the sense amplifier connected to the second bit line is controlled by a second sense amplifier activation signal activated by the first sense amplifier activation signal.

4. The data transmission circuit of claim 1, wherein
   the plurality of selection circuits are controlled by the first sense amplifier activation signal.

5. The data transmission circuit of claim 1, further comprising:
   a plurality of precharge circuits provided for the plurality of first bit lines; and
   a plurality of read circuits provided for the plurality of first bit lines, wherein
   at least the plurality of read circuits are controlled by the first sense amplifier activation signal.

6. The data transmission circuit of claim 1, further comprising:
   a forced activation circuit configured to activate the first sense amplifier activation signal according to a forced activation signal.

7. The data transmission circuit of claim 6, wherein
   the forced activation signal is a write enable signal.

8. The data transmission circuit of claim 1, further comprising:
   a forced deactivation circuit configured to deactivate the first sense amplifier activation signal according to a forced deactivation signal.

9. The data transmission circuit of claim 1, wherein
   at least one first bit line out of the plurality of first bit lines connected to a same selection circuit does not output data simultaneously according to a second control signal.

10. A semiconductor memory device comprising the data transmission circuit of claim 1, wherein
    a plurality of memory cells are connected to each of the plurality of first bit lines.

11. The semiconductor memory device of claim 10, wherein
    read from the pluralities of memory cells is started by a common control signal, and the pluralities of memory cells are adjacent in a direction parallel to the direction of the common control signal.

12. The semiconductor memory device of claim 10, wherein
    the plurality of first bit lines connected to a same selection circuit are continuous in a direction parallel to the plurality of first bit lines.

13. The semiconductor memory device of claim 10, wherein
    a power supply control circuit is provided for each memory block including the plurality of first bit lines connected to the same sense amplifier via the plurality of selection circuits, and the power supply control circuit is connected to power supply of the plurality of memory cells included in the memory block.

14. The semiconductor memory device of claim 10, wherein
    a power supply control circuit is provided for each bit block having a plurality of memory cells connected to a same output terminal, and the power supply control circuit is connected to power supply of the plurality of memory cells included in the bit block.

15. The semiconductor memory device of claim 10, wherein
    the shape of the plurality of memory cells in each bit block having the plurality of memory cells connected to a same output terminal is different every bit block.

16. The semiconductor memory device of claim 10, wherein
    the shape of the plurality of memory cells in each memory block including the plurality of first bit lines connected to the same sense amplifier via the plurality of selection circuits is different every memory block.

* * * * *